United States Patent
Yang et al.

(10) Patent No.: US 12,238,979 B2
(45) Date of Patent: Feb. 25, 2025

(54) DISPLAY SUBSTRATE AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Fuqiang Yang, Beijing (CN); Pan Zhao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 541 days.

(21) Appl. No.: 17/618,475

(22) PCT Filed: Feb. 2, 2021

(86) PCT No.: PCT/CN2021/074884
§ 371 (c)(1),
(2) Date: Dec. 12, 2021

(87) PCT Pub. No.: WO2021/196868
PCT Pub. Date: Oct. 7, 2021

(65) Prior Publication Data
US 2022/0359632 A1    Nov. 10, 2022

(30) Foreign Application Priority Data
Mar. 31, 2020    (CN) .......................... 202020451671.0

(51) Int. Cl.
*H10K 59/124* (2023.01)
*H10K 50/844* (2023.01)
(Continued)

(52) U.S. Cl.
CPC ......... *H10K 59/124* (2023.02); *H10K 50/844* (2023.02); *H10K 71/00* (2023.02); *H10K 59/1201* (2023.02); *H10K 2102/351* (2023.02)

(58) Field of Classification Search
None
See application file for complete search history.

(56) References Cited

U.S. PATENT DOCUMENTS

| 2019/0074459 A1 | 3/2019 | Kim et al. |
| 2021/0028249 A1* | 1/2021 | Ding ................... H01L 27/1288 |

(Continued)

FOREIGN PATENT DOCUMENTS

| CN | 107946341 A | 4/2018 |
| CN | 109119446 A | 1/2019 |

(Continued)

OTHER PUBLICATIONS

European Patent Office, Extended European Search Report, Appl'n. No. EP21772937.5, Jun. 27, 2023.

*Primary Examiner* — Michael Lebentritt
(74) *Attorney, Agent, or Firm* — HOUTTEMAN LAW LLC

(57) ABSTRACT

A display substrate and a display panel are provided. The display substrate has an opening region, a transition region surrounding the opening region, and a display region surrounding the transition region; the display substrate includes: a base plate, post spacers and dam structures on the base plate and in the transition region and surrounding the opening region; the post spacers include a first post spacer on a side of the dam structures proximal to the display region; an organic light emitting diode, a first encapsulation layer, a second encapsulation layer and a third encapsulation layer are sequentially arranged on the base plate, the organic light emitting diode is in the display region, and orthographic projections of the first encapsulation layer and the (Continued)

third encapsulation layer on the base plate at least cover the display region and the transition region.

20 Claims, 6 Drawing Sheets

(51) Int. Cl.
 *H10K 59/12* (2023.01)
 *H10K 71/00* (2023.01)
 *H10K 102/00* (2023.01)

(56) References Cited

U.S. PATENT DOCUMENTS

2022/0093895 A1* 3/2022 Zhang ................. H10K 59/122
2022/0102434 A1* 3/2022 Liu ....................... H10K 59/88

FOREIGN PATENT DOCUMENTS

| | | | | |
|---|---|---|---|---|
| CN | 110010665 A | | 7/2019 | |
| CN | 110034237 A | * | 7/2019 | ......... H01L 27/3246 |
| CN | 110265459 A | * | 9/2019 | ........... G06F 3/0412 |
| CN | 110265583 A | | 9/2019 | |
| CN | 111276507 A | * | 6/2020 | ........... H01L 23/481 |
| CN | 111384108 A | * | 7/2020 | ......... H01L 27/3246 |
| CN | 211929490 U | | 11/2020 | |
| CN | 114846617 B | * | 11/2023 | ............. G06F 3/041 |
| CN | 117135957 A | * | 11/2023 | |
| WO | WO-2022226899 A1 | * | 11/2022 | ......... H10K 59/1201 |

\* cited by examiner

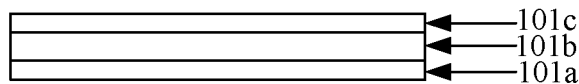

FIG. 7

| Forming the driving circuit layer, the organic light emitting diode 1d, the post spacers and the dam structures 150 on the base plate 101 such that the post spacers include the first post spacer 120 located on a side of the dam structures 150 proximal to the display region Q1 | S01 |

↓

| Sequentially forming the first encapsulation layer 118a, the second encapsulation layer 118b and the third encapsulation layer 118c on a layer where the second electrode 115 of the organic light emitting diode 1d is located, to seal the organic light emitting diode 1d | S02 |

FIG. 8

DISPLAY SUBSTRATE AND DISPLAY PANEL

TECHNICAL FIELD

The present disclosure relates to the field of display technology, and in particular to a display substrate and a display panel.

BACKGROUND

With the increasing demand of a user for products and due to the intense competitive environment in the industry, most mobile phone manufacturers are pursuing a higher screen-to-body ratio of a screen, so as to bring a dazzler visual impact to the user and therefore, win the market competition. However, the development of a screen having a higher screen-to-body ratio is limited by some cameras and sensors, and it is highly concerned in the industry to place the cameras and sensors in the screen.

SUMMARY

The present disclosure aims to solve at least one of the technical problems in the prior art and provides a display substrate and a display panel.

In a first aspect, an embodiment of the present disclosure provides a display substrate having an opening region, a transition region surrounding the opening region, and a display region surrounding the transition region; the display substrate includes: a base plate, post spacers and dam structures on the base plate, located in the transition region and surrounding the opening region; wherein the post spacers include a first post spacer on a side of the dam structures proximal to the display region; an organic light emitting diode, a first encapsulation layer, a second encapsulation layer and a third encapsulation layer sequentially arranged on the base plate, wherein the organic light emitting diode is in the display region, and orthographic projections of the first encapsulation layer and the third encapsulation layer on the base plate at least cover the display region and the transition region; and an orthographic projection of the second encapsulation layer on the base plate covers the display region and the first post spacer in the transition region; wherein a ratio of a thickness of a part of the second encapsulation layer on the first post spacer to a thickness of the first post spacer is 2:1 to 6:1.

In some embodiments, the first post spacer includes a first sub-post spacer adjacent to the dam structures, and a ratio of an average thickness of a region of the second encapsulation layer where the orthographic projection of the second encapsulation layer on the base plate overlaps the first sub-post spacer to the thickness of the first sub-post spacer is 2:1 to 6:1.

In some embodiments, a ratio of a thickness of the region of the second encapsulation layer where the orthographic projection of the second encapsulation layer on the base plate overlaps the first sub-post spacer to the thickness of the first sub-post spacers is 6:1.

In some embodiments, the thickness of the second encapsulation layer gradually decreases from the display region to the transition region.

In some embodiments, the first sub-post spacer includes: a first sub-isolation layer, a second sub-isolation layer and a third sub-isolation layer which are sequentially stacked; and orthographic projections of the first sub-isolation layer and the third sub-isolation layer on the base plate coincide with each other, and an orthographic projection of the second sub-isolation layer on the base plate falls in the orthographic projection of the first sub-isolation layer on the base plate.

In some embodiments, each of the first sub-isolation layer and the third sub-isolation layer has a thickness of 0.04 μm to 0.08 μm; and a thickness of the second sub-isolation layer is 0.4 μm to 0.6 μm.

In some embodiments, a material of each of the first sub-isolation layer and the third sub-isolation layer includes titanium and a material of the second post spacer includes aluminum.

In some embodiments, particles are attached to a surface of the second sub-isolation layer proximal to the third sub-isolation layer.

In some embodiments, the third sub-isolation layer is warped relative to a plane where the base plate is located.

In some embodiments, a groove is provided on a lateral side of the first sub-post spacer.

In some embodiments, the display substrate further includes a driving circuit layer on the base plate; the driving circuit layer at least includes a driving transistor, and a drain of the driving transistor is connected to a first electrode of the organic light emitting diode; a source and the drain of the driving transistor and the post spacers are in a same layer and are made of a same material.

In some embodiments, a planarization layer is between the source and the drain of the driving transistor and a layer where the first electrode of the organic light emitting diode is located; and the drain of the driving transistor is connected to the first electrode of the organic light emitting diode through a via penetrating through the planarization layer.

In some embodiments, a passivation layer, a connection electrode, a first sub-planarization layer and a second sub-planarization layer are sequentially arranged between the source and the drain of the driving transistor and a layer where the first electrode of the organic light emitting diode is located; the connection electrode is connected to the drain of the driving transistor through a via penetrating through the passivation layer and the first sub-planarization layer, and the first electrode of the organic light emitting diode is connected to the connection electrode through a via penetrating through the second sub-planarization layer.

In some embodiments, a plurality of dam structures are in the transition region, and are adjacent to each other; an auxiliary structure is below a dam structure of the plurality of the dam structures at least proximal to the opening region such that the dam structure in two adjacent dam structures proximal to the opening region protrudes from a direction distal to the base plate than the other dam structure; the auxiliary structure and the planarization layer are in a same layer and are made of a same material.

In some embodiments, the display substrate further includes a driving circuit layer on the base plate; the driving circuit layer at least includes a driving transistor and an interlayer dielectric layer, an active layer of the driving transistor is on a side of the base plate proximal to the organic light emitting diode; a first gate insulating layer covers the active layer, a gate of the driving transistor is on a side of the first gate insulating layer distal to the active layer; a second gate insulating layer covers the gate and the first gate insulating layer; the interlayer dielectric layer covers the second gate insulating layer; the source and the drain of the driving transistor are on a side of the interlayer dielectric layer distal to the base plate; the first post spacer includes a first sub-post spacer adjacent to the dam structures and a second sub-post spacer on a side of the first sub-post spacer proximal to the display region; and a first slot is arranged between the first sub-post spacer and the second sub-post spacer, and a second slot is arranged between the first sub-post spacer and the dam structures; the first slot and the second slot penetrate through at least one of the interlayer dielectric layer, the first gate insulating layer and the second gate insulating layer.

In some embodiments, a thickness of the first encapsulation layer is 1 μm to 2 μm; a thickness of the second encapsulation layer is 10 μm to 15 μm; and a thickness of the third encapsulation layer is 0.5 μm to 1 μm.

In a second aspect, an embodiment of the present disclosure provides a method for manufacturing a display substrate having an opening region, a transition region surrounding the opening region, and a display region surrounding the transition region; the method for manufacturing the display substrate includes steps of:

forming post spacers and dam structures on a base plate such that the post spacers and the dam structures are both arranged in the transition region and surround the opening region; the forming the post spacers includes forming a first post spacer such that the first post spacer is arranged on a side of the dam structures proximal to the display region; and sequentially forming an organic light emitting diode, a first encapsulation layer, a second encapsulation layer and a third encapsulation layer on a side of a layer where the post spacers are located distal to the base plate such that the organic light emitting diode is located in the display region, and orthographic projections of the first encapsulation layer and the third encapsulation layer on the base plate at least cover the display region and the transition region; and an orthographic projection of the second encapsulation layer on the base plate covers the display region and the first post spacer of the transition region;

wherein a ratio of a thickness of a part of the second encapsulation layer on the first post spacer to a thickness of the first post spacer is 2:1 to 6:1.

In some embodiments, the first post spacer includes a first sub-post spacer adjacent to the dam structures, and a ratio of an average thickness of a region of the second encapsulation layer where the orthographic projection of the second encapsulation layer on the base plate overlaps the first sub-post spacer to the thickness of the first sub-post spacer is 2:1 to 6:1.

In some embodiments, the manufacturing method further includes: forming a driving circuit layer on a side of the post spacers proximal to the base plate such that the driving circuit layer at least includes a driving transistor;

forming a source and a drain of the driving transistor and the post spacers through one single patterning process.

In some embodiments, between forming a first electrode of the organic light emitting diode and forming a light emitting layer of the organic light emitting diode, the manufacturing method further includes forming a pixel defining layer having a receiving portion that receives the light emitting layer such that the dam structures and the pixel defining layer are formed through one single patterning process.

In some embodiments, a plurality of dam structures are provided in the transition region, and are adjacent to each other; an auxiliary structure is formed below a dam structure of the plurality of the dam structures at least proximal to the opening region such that a dam structure in two adjacent dam structures proximal to the opening region protrudes from a direction distal to the base plate than the other dam structure; a planarization layer is formed between a layer where the source and the drain of the driving transistor are located and a layer where the first electrode of the organic light emitting diode is located, and the first electrode is connected to the drain of the driving transistor through a via penetrating through the planarization layer; the auxiliary structure and the planarization layer are formed through one patterning process.

In a third aspect, an embodiment of the present disclosure provides a display panel, which includes the above display substrate.

BRIEF DESCRIPTION OF DRAWINGS

FIG. 7 is a schematic structural diagram of a base plate of a display substrate according to an embodiment of the disclosure.

FIG. 8 is a flowchart of a method for manufacturing a display substrate according to an embodiment of the disclosure.

DETAIL DESCRIPTION OF EMBODIMENTS

Figure 1:
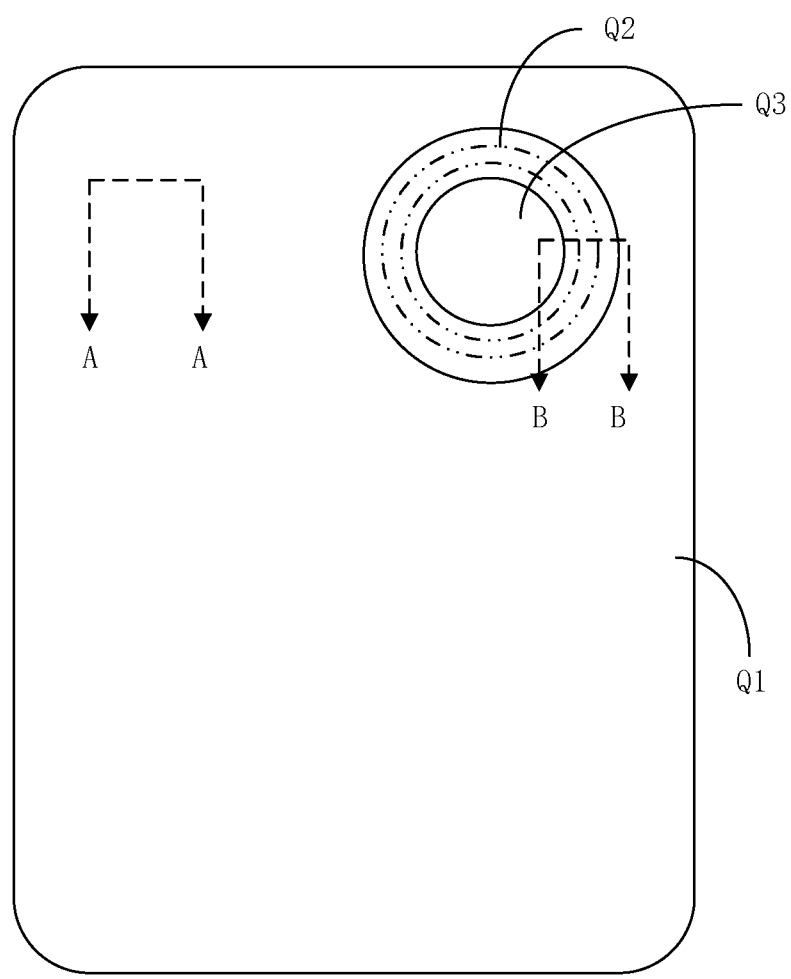
FIG. 1 is a schematic diagram of a distribution of respective regions of a display substrate according to an embodiment of the disclosure.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like herein are not intended to indicate any order, quantity, or importance, but rather are used for distinguishing one element from another. Further, the term of "a", "an", "the", or the like used herein does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

In a first aspect, as shown in FIGS. 1 to 4, embodiments of the present disclosure provide a display substrate divided into a display region Q1, a transition region Q2, and an opening region Q3; the transition region Q2 surrounds the opening region Q3, and the display region Q1 surrounds the transition region Q2. The display substrate includes a base plate 101, and a pixel structure disposed on the base plate 101 and located in the display region Q1. The pixel structure at least includes a driving circuit layer and a light emitting device. The driving circuit layer (i.e. an existing pixel driving circuit of 2T1C) usually includes at least a switching transistor, a driving transistor, and a storage capacitor. The light emitting device includes, but is not limited to, an organic light emitting diode (OLED) 1d. The display substrate further includes at least one post spacer 120 located in the transition region Q2; a planarization layer 117 is formed on a side of a layer where the at least one post spacer 120 is located distal to the base plate 101, and a via is etched in the display region Q1 corresponding to a drain 111 of the driving transistor in the driving circuit layer, so that a first electrode 112 of the organic light emitting diode 1d formed on the planarization layer 117 may be connected to the drain 111 of the driving transistor through the via. Since the at least one post spacer 120 is formed in the transition region Q2, a light emitting layer 114 and a second electrode 115 of the organic light emitting diode in the transition region Q2 between the display region Q1 and the opening region Q3 are disconnected from (i.e. separated from) the light emitting layer 114 and the second electrode 115 of the organic light emitting diode in the display region Q1 and the opening region Q3, so as to avoid the presence of the via in the opening region, which may cause water, oxygen and the like to corrode the organic light emitting diode 1d in the display region, thereby causing a poor display. Of course, the display substrate further includes a first encapsulation layer 118a, a second encapsulation layer 118b, and a third encapsulation layer 118c sequentially disposed on the second electrode 115 of the organic light emitting diode 1d. The display substrate further includes a through hole which is located in the opening region Q3 and penetrates through the display substrate.

It is noted that in the display substrate according to the embodiment of the present disclosure, the through hole is formed after the opening region Q3 is punched, and is used for installing devices such as a camera, a sensor, a HOME key, a handset, or a speaker. In the display substrate according to the embodiment of the present disclosure, the opening region Q3 is not punched, and the punching process may be performed before installing devices such as a camera. In addition, in the display substrate of the embodiment of the present disclosure, the opening region Q3 has been punched. In this case, the display substrate may be directly used for subsequent assembly.

The structures of the display region Q1, the transition region Q2, and the opening region Q3 will be described in detail below.

Figure 2:
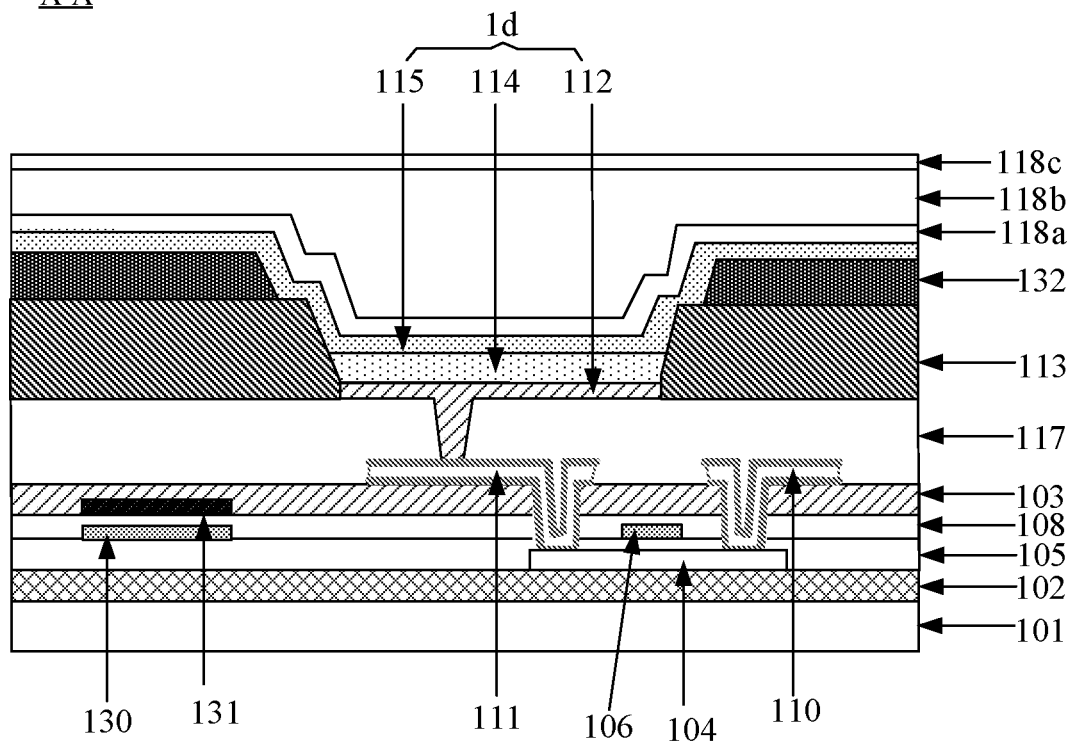
FIG. 2 is a cross-sectional view taken along an A-A line in the display substrate of FIG. 1.

In some embodiments, as shown in FIG. 2, the driving circuit layer may be formed on a buffer layer 102. The driving circuit layer may include an interlayer dielectric layer 103 located in the display region Q1 and the transition region Q2, where the interlayer dielectric layer 103 is made of an inorganic material, for example: inorganic materials such as silicon oxide and silicon nitride, so as to achieve effects of preventing water and oxygen and blocking alkaline ions. The driving circuit layer further includes a driving transistor and a storage capacitor in the display region, and further includes a switching element such as a switching transistor, which has the same structure as the driving transistor and may be manufactured in one process, so that the description thereof is omitted.

Figure 3:
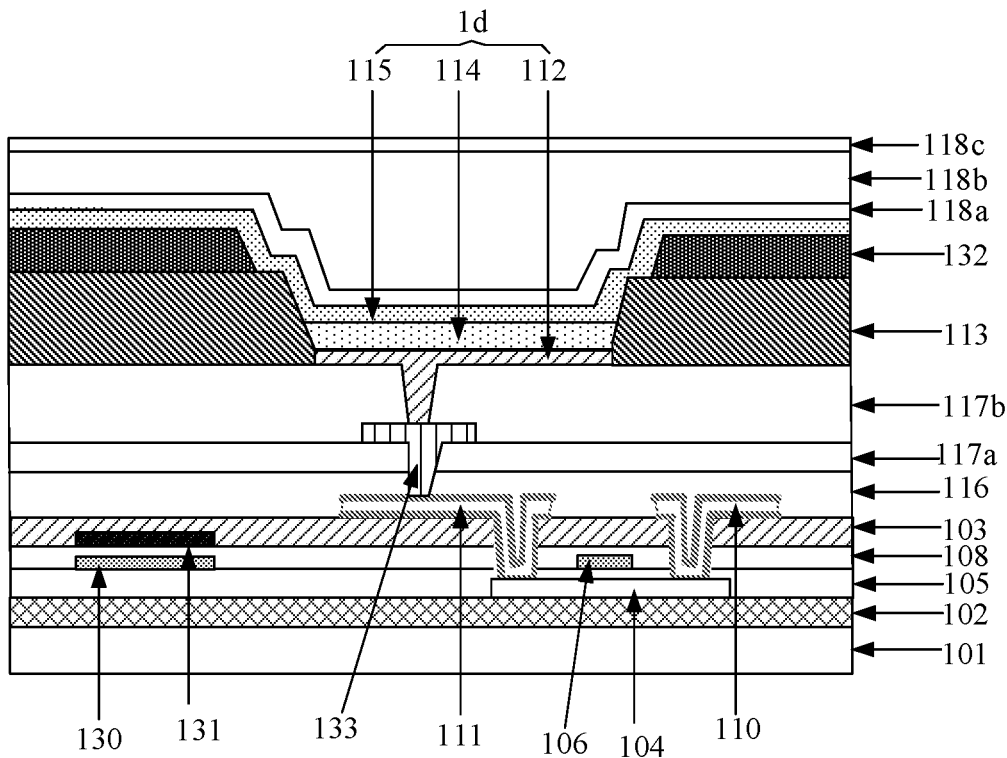
FIG. 3 is a cross-sectional view taken along an A-A line in the display substrate of FIG. 1.

As shown in FIG. 3, the driving transistor may be a top gate type, and the driving transistor may include an active layer 104, a first gate insulating layer 105, a gate 106, a second gate insulating layer 108, an interlayer dielectric layer 103, a source 110, and a drain 111. Specifically, the active layer 104 may be formed on the buffer layer 102, the first gate insulating layer 105 covers the buffer layer 102 and the active layer 104, the gate 106 is formed on a side of the first gate insulating layer 105 distal to the active layer 104, the second gate insulating layer 108 covers the gate 106 and the first gate insulating layer 105, the interlayer dielectric layer 103 covers the second gate insulating layer 108, the source 110 and the drain 111 are formed on a side of the interlayer dielectric layer 103 distal to a base substrate and are respectively located on two opposite sides of the gate 106, and the source 110 and the drain 111 may respectively contact with a source contact region and a drain contact region on two opposite sides of the active layer 104 through vias (e.g., metal vias). It should be understood that this driving transistor may also be of a bottom gate type.

As shown in FIG. 3, a capacitor structure may include a first electrode plate 130 and a second electrode plate 131, the first electrode plate 130 and the gate 103 are disposed in a same layer, and the second electrode plate 131 is disposed between the second gate insulating layer 105 and the interlayer dielectric layer 103 and opposite to the first electrode plate 130.

For example, the material of the gate 103 and the first and second electrode plates 130 and 131 may include a metal material or an alloy material, such as molybdenum, aluminum, titanium, and the like. The source 110 and the drain 111 may include a metal material or an alloy material, such as a metal single layer or a multi-layer structure formed of molybdenum, aluminum, titanium, and the like. For example, the multi-layer structure is a multi-layer metal stack, such as a three-layer metal stack (Al/Ti/Al) made of titanium, aluminum, titanium, and the like.

As shown in FIG. 2, a planarization layer 117 is provided on a side of the driving transistor distal to the base plate 101, and is located in the display region Q1. The planarization layer 117 is usually made of an organic material, such as: photoresist, acrylic-based polymers, silicon-based polymers, and the like.

As shown in FIG. 2, the organic light emitting diode 1d is located in the display region Q1, and may include a first electrode 112 of the organic light emitting diode 1d and a pixel defining layer 113 sequentially formed on the planarization layer 117. It will be understood that the organic light emitting diode 1d may further include the light emitting layer 114 and the second electrode 115.

The first electrode 112 of the organic light emitting diode 1d may be electrically connected to the drain 111 of the driving transistor through a via penetrating through the planarization layer 117, and may be an anode made of ITO (indium tin oxide), Indium Zinc Oxide (IZO), zinc oxide (ZnO), or the like. The pixel defining layer 113 may cover the planarization layer 117, and may be made of an organic material, such as photoresist; and the pixel defining layer 113 may have a receiving portion exposing the first electrode 112. The light emitting layer is located in the receiving portion and formed on the first electrode 112, may include a small molecule organic material or a polymer molecule organic material, which may be a fluorescent light emitting material or a phosphorescent light emitting material, may emit red light, green light, blue light, or may emit white light, etc. In addition, according to different practical needs, in different examples, the light emitting layer 114 may further include functional layers such as an electron injection layer, an electron transport layer, a hole injection layer, and a hole transport layer. The second electrode 115 covers the light emitting layer, and a polarity of the second electrode 115 is opposite to that of the first electrode 112. The second electrode 115 may be a cathode made of a metal material such as lithium (Li), aluminum (Al), magnesium (Mg), silver (Ag), etc.

Note that, as shown in FIG. 2, the first electrode 112, the light emitting layer, and the second electrode 115 may constitute one organic light emitting diode 1*d*. The display region Q1 includes organic light emitting diodes 1*d* arranged in an array. In addition, it should be noted that the first electrodes 112 of respective organic light emitting diodes 1*d* are independent from each other, and the second electrodes 115 of respective organic light emitting diodes 1*d* may be connected as a whole. That is, the second electrodes 115 are a whole structure disposed on the display substrate 10, and is a common electrode for the plurality of organic light emitting diodes 1*d*.

In some embodiments, as shown in FIG. 3, the first electrode 112 of the organic light emitting diode 1*d* may also be electrically connected to the drain 111 through a connection electrode 133. When the first electrode 112 is electrically connected to the drain 111 through the connection electrode 133, the planarization layer 117 may have a double-layer structure, and specifically may include a first sub-planarization (PLN1) layer 117*a* and a second sub-planarization (PLN2) layer 117*b* formed in sequence. In addition, a passivation (PVX) layer 116 may be further formed between the first sub-planarization layer 117*a* and the interlayer dielectric layer 103, and may be made of silicon oxide, silicon nitride, or silicon oxynitride; the passivation layer 116 covers the source 110 and the drain 111. The connection electrode 133 is formed between the first sub-planarization layer 117*a* and the second sub-planarization layer 117*b*, and is electrically connected to the drain 111 through vias (e.g., metal vias) on the first sub-planarization layer 117*a* and the passivation layer 116 in sequence; the first electrode 112 may be electrically connected to the connection electrode 133 through a via (e.g., a metal via) on the second sub-planarization layer 117*b*, thereby completing the connection between the first electrode 112 of the organic light emitting diode 1*d* and the drain 111 of the driving transistor. In some embodiments, as shown in FIGS. 2 and 3, a support portion 132 may be further disposed on a side of the pixel defining layer 113 distal to the interlayer dielectric layer 103, and may function as a support protective film (not shown) to prevent the first electrode 112 or other traces from being easily damaged due to the protective film contacting the first electrode 112 or other traces. It should be noted that the protective film is mainly present during a transfer of a semi-finished product to prevent the semi-finished product from being damaged during the transfer. Specifically: in the procedure of transferring the substrate on which the support portion 132 is formed to a deposition production line, the protective film may be covered on the substrate, and when deposition of the light emitting material is required, the protective film may be removed.

The material of the support portion 132 may be the same as the material of the pixel defining layer 113, and the support portion 132 and the pixel defining layer 113 may be formed by a same patterning process, which is not limited thereto. The material of the support portion 132 may also be different from the material of the pixel defining layer 113, and the support portion 132 and the pixel defining layer 113 may also be formed by different patterning processes.

Figure 4:
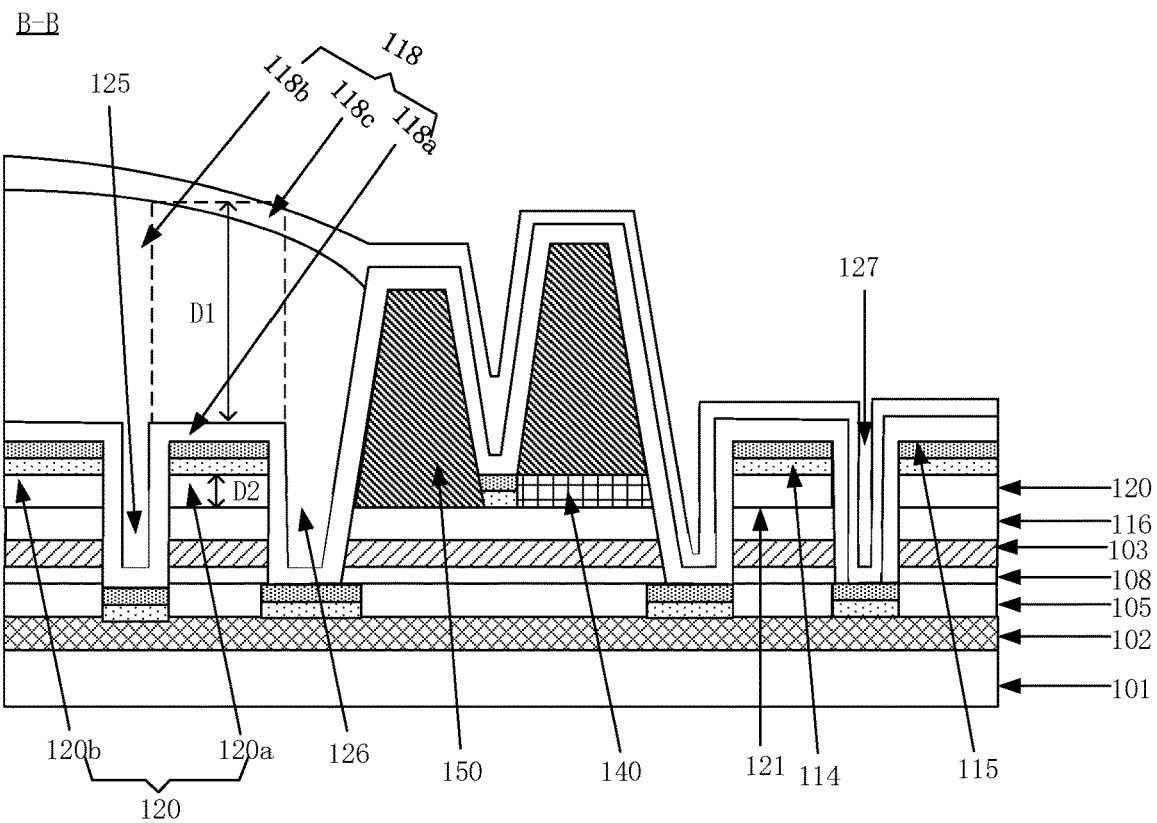
FIG. 4 is a cross-sectional view taken along a B-B line in the display substrate of FIG. 1.

In some embodiments, as shown in FIG. 4, the post spacers 120 are located in the transition region Q2, are disposed around the opening region Q3, and are disposed on a side of the passivation layer 116 distal to the base plate 101. The light emitting layer 114 is disconnected between the post spacers 120 of the transition region Q2, and the second electrode 115 of the organic light emitting diode 1*d* is disconnected between the post spacers 120, to avoid the presence of the vias in the opening region Q3, which causes water, oxygen, etc. to corrode the organic light emitting diode 1*d* in the display region, thereby causing a poor display.

In some embodiments, the passivation layer 116 and the second electrode 115 of the organic light emitting diode 1*d* may also be absent in the structure shown in FIG. 4.

As shown in FIG. 4, a dam structure 150 is further disposed in the transition region Q4. When the display substrate is encapsulated by the encapsulation layer 118, the dam structure 150 may limit the flow of an organic encapsulation film material in the encapsulation layer 118, which avoids the problem of encapsulation failure caused by the organic encapsulation film material in the encapsulation layer 118 flowing to the opening region Q3. That is, the dam structure 150 may cooperate with the encapsulation layer 118 to effectively block water and oxygen from entering the display region Q1 through the opening region Q3, so that the problem of poor display effect caused by the failure of the organic light emitting diode 1*d* in the display region Q1 may be avoided, and the service life of the product is prolonged.

Figure 5:
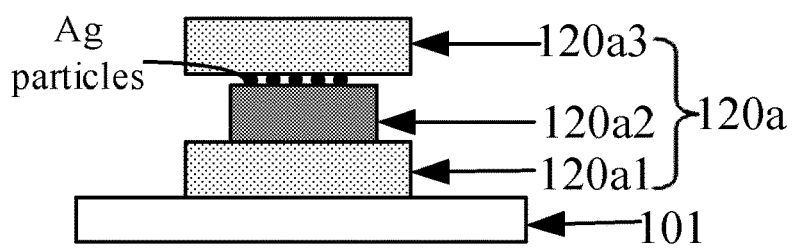
FIG. 5 is a schematic structural diagram illustrating a post spacer of a display substrate according to an embodiment of the disclosure.

In detail, as shown in FIGS. 3 to 5, the encapsulation layer 118 of the display substrate 10 may include the first encapsulation layer 118*a*, the second encapsulation layer 118*b*, and the third encapsulation layer 118*c*, which are sequentially stacked. The first encapsulation layer 118*a* and the third encapsulation layer 118*c* encapsulate the organic light emitting diode 1*d*, the post spacers 120, and the dam structures 150, and the second encapsulation layer 118*b* encapsulates the organic light emitting diode 1*d* and blocks at a side of the dam structure 150 proximal to the display region Q1. The first encapsulation layer 118*a* and the third encapsulation layer 118*c* are used to prevent water and oxygen from entering the light emitting layer 114 in the display region Q1 from a display side of the display function and the opening region Q3; the first encapsulation layer 118*a* and the third encapsulation layer 118*c* may be made of inorganic materials such as silicon nitride and silicon oxide. The second encapsulation layer 118*b* is used for achieving the planarization, so as to facilitate to form the third encapsulation film 118*c*, and the second encapsulation layer 118*b* may be made of acrylic-based polymer, silicon-based polymer, etc.

The first encapsulation layer 118*a* and the third encapsulation layer 118*c* may be formed by a chemical vapor deposition process, which is not limited thereto. The first encapsulation layer 118*a* and the third encapsulation layer 118*c* may be formed by a physical vapor deposition process. The second encapsulation layer 118*b* is formed by an inkjet printing process, which is not limited thereto. The second encapsulation layer 118*b* is formed by a spraying process or the like. In the process of manufacturing the second encapsulation layer 118*b*, since the second encapsulation layer 118*b* has a certain fluidity, the flow of the material of the second encapsulation layer 118*b* may be limited by the provision of the dam structures 150, so as to avoid the problem of encapsulation failure caused by the flow of the material of the second encapsulation layer 118*b* to the opening region Q3.

In the embodiment of the present disclosure, the dam structures 150 and the pixel defining layer 113 are disposed in a same layer. That is: the dam structures 150 and the pixel defining layer 113 may be formed simultaneously by one patterning process, which may reduce the number of processing steps and the number of the use of masks, thereby reducing the cost. Further, it should be understood that the dam structures and the pixel defining layer 113 should be disconnected from each other. Of course, the dam structure 150 may be a structure formed of stacked insulating materials, for example, a structure formed by stacking a first sub-dam layer disposed in a same layer as the pixel defining layer 113 and a second sub-dam layer disposed in a same layer as the support portion 132.

In some embodiments, as shown in FIG. 4, the post spacers include a first post spacer 120 located on a side of the dam structure proximal to the display region Q1; wherein the first post spacer 120 includes a first sub-post spacer 120*a* disposed adjacent to the dam structure 150. The number of the first sub-post spacers 120*a* may be one, or may be multiple. In the embodiment of the present disclosure, as an example, the number of the first sub-post spacers 120*a* is one. Of course, the first post spacer 120 may further include a second sub-post spacer 120*b* located on a side of the first sub-post spacer 120*a* proximal to the display region Q1, a structure of the second sub-post spacer 120*b* may be the same as or different from that of the first sub-post spacer 120*a*. The embodiment of the present disclosure will be described by taking an example in which the second sub-post spacer 120*b* is the same as the first sub-post spacer 120*a*. The number of the second sub-post spacers 120*b* may also be one or multiple. In the embodiment of the present disclosure, as an example, the number of the second sub-post spacers 120*b* is one.

In some embodiments, the post spacers may further include a second post spacer 121 located on a side of the dam structure proximal to the transition region Q2, where the number of the second post spacers 121 may be one or multiple, and the structure of the second post spacer 121 may be consistent with that of the first sub-post spacer 120*a* or the second sub-post spacer 120*b*. Alternatively, the structure of the second post spacer 121 is not consistent with that of the first sub-post spacer 120*a* or the second sub-post spacer 120*b*. The embodiment of the present disclosure will be described by taking an example in which the structure of the second post spacer 121 may be consistent with that of the first sub-post spacer 120*a* or the second sub-post spacer 120*b*. The post spacer illustrated in FIG. 4 includes two second post spacers 121, which does not limit the embodiments of the present disclosure.

Figure 6:
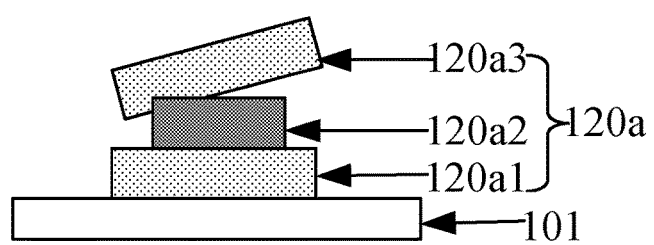
FIG. 6 is a schematic structural diagram illustrating a post spacer of a display substrate according to an embodiment of the disclosure.

In some embodiments, as shown in FIGS. 5 and 6, a specific structure of the first sub-post spacer 120*a* is provided, the first sub-post spacer 120*a* having such the structure is used to ensure that the light emitting layer 114 of the organic light emitting diode 1*d* is completely disconnected at an edge of the first post spacer 120*a* in the transition region Q2, the first sub-post spacer 120*a* may include a three-layer structure of a first sub-isolation layer 120*a*1, a second sub-isolation layer 120*a*2 and a third sub-isolation layer 120*a*3, which are stacked, wherein orthographic projections of the first sub-isolation layer 120*a*1 and the third sub-isolation layer 120*a*3 on the base plate 110 may be coincident with each other, and an orthographic projection of the second sub-isolation layer 120*a*2 on the base plate falls within the orthographic projection of the first sub-isolation layer 120*a*1 on the base plate 101. That is, a cross section of the first post spacer 120*a* in a direction perpendicular to the base plate 101 has a groove (as shown in FIGS. 5 and 6, a side surface of the second sub-isolation layer 120*a*2 is recessed compared to the first sub-isolation layer 120*a*1 and the third sub-isolation layer 120*a*2, i.e., a side surface groove of the post spacer is formed). The first sub-isolation layer 120*a*1 and the third sub-isolation layer 120*a*3 of the post spacer 120 are made of Ti, and the second sub-isolation layer 120*a*2 is made of Al. In the process of forming the second sub-isolation layer 120*a*2, the metal Al material and Ag ions in the etching solution undergo a displacement reaction during wet etching to form Ag particles each having a size of about 1 μm to 5 μm, which have strong adhesion and are not easy to remove, and finally become conductive particles, which appear as dark spots. When the structure of the second sub-isolation layer 120*a*2 is formed by etching, Ag ions in the etching solution may be displaced, so that a layer of silver particles is attached to an upper surface of the second sub-isolation layer 120*a*2 (as shown in FIG. 5), and the third sub-isolation layer 120*a*3 in the formed first post spacer 120*a* may also be warped due to process reasons (as shown in FIG. 6). This may result in a risk of breakage of the third encapsulation layer 118*c* over the formed post spacer at a position corresponding to the post spacer, and may result in a failure of encapsulation for the display substrate once the third encapsulation layer 118*c* is broken.

In order to solve the above technical problem, an embodiment of the present disclosure provides a display substrate, where a ratio of a thickness of the second encapsulation layer 118*b* located on a side of the dam structure 150 proximal to the display region Q1 and on a side of the first post spacer 120 adjacent to the dam structure 150, distal to the base plate 101, to a thickness of the first post spacer 120 includes 2:1 to 6:1, so that a surface of the formed second encapsulation layer 118*b* distal to the base plate 101 is substantially flat, thereby avoiding a problem of a failure of encapsulation for the display substrate caused by breakage of the third encapsulation layer 118*c* formed on a surface of the second encapsulation layer 118*b* distal to the base plate 101.

In some embodiments, as shown in FIG. 4, a ratio of an average thickness D1 of a region where an orthographic projection of the second encapsulation layer 118*b* on the base plate 101 overlaps the first sub-post spacer 120*a* to the thickness D2 of the first sub-post spacer 120*a* is 2:1 to 6:1. For example, when D1:D2 is 2:1, a surface of the second encapsulation layer 118*b* distal to the base plate 101 may be substantially flat; when D1:D2 is 6:1, it may prevent the third encapsulation layer 118*c* formed on the second encapsulation layer 118*b* from breaking, and prevent the second encapsulation layer 118*b* from being too thick, which may affect the lightness and thinness of the display substrate. This is because for the second encapsulation layer 118*b*, due to the fluidity of the material thereof, the thickness of the second encapsulation layer 118*b* becomes thinner as it approaches the dam structure 150. That is, the thickness of the second encapsulation layer 118*b* gradually decreases from the display region Q1 to the transition region Q2, and the first sub-post spacer is arranged adjacent to the dam structure 150, once the ratio of the average thickness D1 of the region where the orthographic projection of the second encapsulation layer 118*b* on the base plate 101 is overlapped with the first sub-post spacer 120*a* to the thickness D2 of the first sub-post spacer 120a is 2:1 to 6:1, a ratio of a thickness of the second encapsulation layer 118b at rest positions of the transition region Q2 to the thickness D2 of the first sub-post spacer 120a is necessarily greater than 2:1 to 6:1, therefore, the problem of a failure of the encapsulation for the display substrate due to the breakage of the third encapsulation layer 118c formed on a surface of the second encapsulation layer 118b distal to the base plate 101 may be completely avoided. In some embodiments, the ratio of the average thickness D1 of the region where the orthographic projection of the second encapsulation layer 118b on the base plate 101 overlaps the first sub-post spacer 120a to the thickness D2 of the first sub-post spacer 120a is 6:1. Thus, the thickness of the second encapsulation layer 118b is designed reasonably to prevent the third encapsulation layer 118c formed on the second encapsulation layer 118b from breaking, and prevent the second encapsulation layer 118b from being too thick, which may affect the lightness and thinness of the display substrate. Alternatively, the second encapsulation layer 118b and the first sub-post spacer 120a with corresponding thickness ratios are adopted according to product requirements. For example, the ratio of the thickness D1 of the second encapsulation layer 6 to the thickness D2 of the first sub-post spacer 120a is 2:1, 3:1, 4:1, etc.

In some embodiments, a thickness of the post spacer includes, but is not limited to, 0.4 µm to 0.7 µm. Alternatively, the post spacer 120 having different thicknesses may be selected according to a thickness of the light emitting layer 114 of the organic light emitting diode 1d, as long as the thickness of the post spacer is sufficient such that the light emitting layer 114 of the organic light emitting diode 1d is disconnected (i.e. broken) in the transition region Q2.

In some embodiments, the post spacer may be disposed in a same layer as the source 110 and the drain 111 of the driving transistor. That is: the post spacer, the source 110 and the drain 111 are formed through a same patterning process, which may reduce the processing steps and the use of a mask, thereby reducing the cost. In addition, it should be understood that the post spacer may be disconnected from the source 110 and the drain 111 of the driving transistor to avoid the situation that the post spacer 124 is powered on when displaying.

Since the post spacer may be disposed in a same layer as the source 110 and the drain 111 of the thin film transistor in the display region as mentioned above, the structure and the material of the post spacer may be the same as those of the source 110 and the drain 111. For example, when the source 110 and the drain 111 are a three-layer metal structure, the post spacer may also be a three-layer metal structure.

Specifically, as shown in FIGS. 5 and 6, the first sub-post spacer 120a of the post spacer may include the first sub-isolation layer 120a1, the second sub-isolation layer 120a2, and the third sub-isolation layer 120a3 sequentially stacked on the interlayer dielectric layer 103, and an outer boundary of the orthographic projection of the second sub-isolation layer 120a2 on the interlayer dielectric layer 103 is located inside an outer boundary of the orthographic projection of the first sub-isolation layer 120a1 and the third sub-isolation layer 120a3 on the interlayer dielectric layer 103, so as to form a groove on a sidewall of the post spacer 120, so that a longitudinal section of the post spacer 120 is formed as an "I-shaped" structure.

The first sub-isolation layer 120a1 and the third sub-isolation layer 120a3 may be made of a titanium layer. That is: the first sub-isolation layer 120a1 and the third sub-isolation layer 120a3 may be made of titanium (Ti) material. The second sub-isolation layer 120a2 may be made of aluminum (Al) material, which ensures that the first sub-isolation layer 120a1 and the third sub-isolation layer 120a3 are not affected by etching when the second sub-isolation layer 120a2 is etched, which is not limited thereto. The first sub-isolation layer 120a1, the second sub-isolation layer 120a2, and the third sub-isolation layer 120a3 may also be made of other materials, for example: the metal material or alloy material such as molybdenum, aluminum, etc., which is not limited thereto in the present disclosure, as long as the above technical effects may be achieved.

In some embodiments, when the first sub-post spacer 120a includes the first sub-isolation layer 120a1, the second sub-isolation layer 120a2, and the third sub-isolation layer 120a3, a thickness of the first sub-isolation layer 120a1 and a thickness of the third sub-isolation layer 120a3 include, but are not limited to, 0.04 µm to 0.08 µm; a thickness of the second sub-isolation layer 120a2 includes, but is not limited to, 0.4 µm to 0.6 µm. Alternatively, the first sub-isolation layer 120a1, the second sub-isolation layer 120a2, and the third sub-isolation layer 120a3 with different thicknesses may be selected according to the thickness of the light emitting layer 114 of the organic light emitting diode 1d, as long as the total thickness of the first sub-isolation layer 120a1, the second sub-isolation layer 120a2, and the third sub-isolation layer 120a3 is sufficient such that the light emitting layer 114 of the organic light emitting diode 1d is disconnected at the edge of the first sub-post spacer 120a in the transition region Q2.

In some embodiments, as shown in FIG. 4, the driver circuit layer has a first slot 125 and a second slot 126 located in the transition region Q2; the first slot 125 is located between the first sub-post spacer 120a and the second sub-post spacer 120b, and the first slot 125 is disposed around the first sub-post spacer 120a; the second slot 126 is located between the first sub-post spacer 120a and the dam structure 150, and the second slot 126 is disposed around the dam structure, so that the probability of the light emitting material being disconnected at the side of the post spacer 120 may be increased.

The first slot 125 and the second slot 126 may penetrate through at least one of the dielectric layer 103, the first gate insulating layer 105, and the second gate insulating layer 108 in the transition region Q2. For example, the first slot 125 and the second slot 126 may penetrate through the dielectric layer 103, the first gate insulating layer 105, the second gate insulating layer 108, and the passivation layer 116 in the transition region Q2. That is: the slots may extend to the buffer layer 102.

As shown in FIG. 4, the first slot 125 and the second slot 126 may penetrate through the entire driving circuit layer to further increase the probability of the light emitting material or the cathode material being disconnected at the side of the post spacer 124. In addition, the design may also relieve the stress on a portion of the driving circuit layer in the display region 10a, and ensure the connection reliability of each element in the driving circuit layer, when the display substrate 10 is flexible and is bent.

It should be noted that in the embodiment of the present disclosure, a third slot 127 may be further disposed between the first post spacer 120 and the second post spacer 121, and the third slot 127 and the first slot 125 and the second slot 126 may have a same structure. When the opening region Q3 is circular, orthographic projections of the first slot 125, the second slot 126 and the post spacer 120 on the base substrate may also be circular rings; when the opening region Q3 is rectangular, orthographic projections of the first slot 125, the second slot 126, the first sub-post spacer 120a, the second sub-post spacer 120b and the second post spacer 121 on the base plate 101 may also be rectangular rings, which is not limited thereto. The opening region Q3 may also have other regular or irregular shapes, and the first slot 125, the second slot 126, the third slot 127, the first sub-post spacer 120a, the second sub-post spacer 120b, and the second post spacer 121 may have corresponding shapes.

In some embodiments, a thickness of the first encapsulation layer 118a includes, but is not limited to, a range of 1 μm to 2 μm, a thickness of the second encapsulation layer 118b includes, but is not limited to, a range of 10 μm to 15 μm, and a thickness of the third encapsulation layer 118c includes, but is not limited to, a range of 0.5 μm to 1 μm.

In some embodiments, there are a plurality of the dam structures (a plurality of turns of the dam structures) 150 disposed adjacent to each other; an auxiliary structure 140 is provided below the dam structure 150 of the plurality of the dam structures 150 at least proximal to the opening region Q3 so that a dam structure in two adjacent dam structures 150 proximal to the opening region Q3 protrudes from a direction distal to the base plate 101 than the other dam structure.

Specifically, as shown in FIG. 4, by taking an example in which the display substrate includes two dam structures 150, the two dam structures 150 are disposed between a second turn of post spacer 120 and a third turn of post spacer 120 in a direction from the display region Q1 to the opening region, wherein the auxiliary structure 140 is provided on a side of the dam structure 150 which is close to the opening region Q3 proximal to the base plate 101, so that the dam structure 120 protrudes from the direction distal to the base plate 101 than the dam structure 150 distal to the opening region Q3. In this way, even if the first dam structure 150 cannot block the material of the second encapsulation layer 118b in the direction from the display region Q1 to the opening region Q3, the material of the second encapsulation layer 118b may be blocked by the second dam structure 150.

In some embodiments, the auxiliary structure 140 and the planarization layer 117 may be disposed in a same layer and made of a same material. Thus, the auxiliary structure 140 may be formed at the same time as the planarization layer 117 is formed, so that process steps may be simplified and the production efficiency may be improved. Alternatively, the auxiliary structure 140 and at least one of the dielectric layer 103, the first gate insulating layer 105 and the second gate insulating layer 108 may also be disposed in a same layer and made of a same material.

In some embodiments, as shown in FIG. 8, the base plate 101 may be a flexible base plate to improve the flexibility of the display substrate, so that the display substrate 1 may be bendable, and the like, so as to expand the application range of the display substrate, which is not limited thereto, the base plate may also be rigid, and the specific performance of the base substrate may be determined according to the actual requirements of the products.

In addition, the base plate 101 may have a single-layer structure or a multi-layer structure. For example, as shown in FIG. 8, the base substrate may include a polyimide layer 101a, a buffer layer 101b, and a polyimide layer 101c stacked in sequence, where the buffer layer 101b may be made of silicon nitride, silicon oxide, or the like, so as to achieve effects of preventing water and oxygen and blocking alkaline ions. It should be noted that the structure of the base substrate is not limited thereto, and may be determined according to actual requirements.

Figure 9:
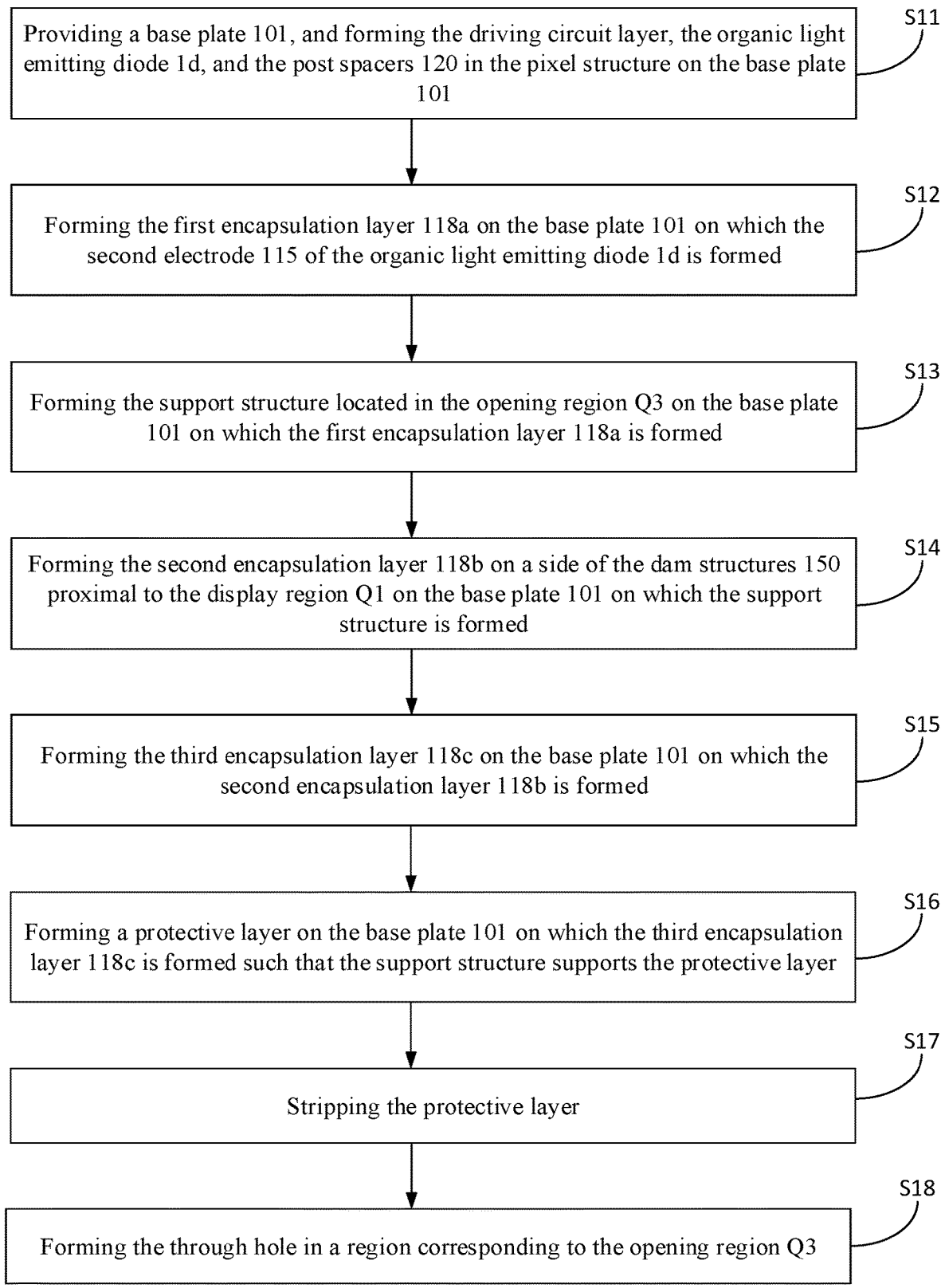
FIG. 9 is a flowchart of a method for manufacturing a display substrate according to an embodiment of the disclosure.

Accordingly, the embodiment of the present disclosure provides a method for manufacturing a display substrate, which may be used for manufacturing the above display substrate. The display substrate is provided with the display region Q1, the transition region Q2 and the opening region Q3; as shown in FIG. 9, the method includes steps of:

S01, forming the driving circuit layer, the organic light emitting diode 1d, at least one post spacer and at least one dam structure 150 on the base plate 101. The at least one post spacer includes the first post spacer 120 located on a side of the at least one dam structure 150 proximal to the display region Q1, and used to cause the light emitting layer to be disconnected (i.e. broken) in the transition region Q2 between the display region Q1 and the opening region Q3, so as to prevent water, oxygen and the like at the via in the opening region Q3 from corroding the organic light emitting diode 1d in the display region Q1, which affects the performance of the organic light emitting diode 1d.

S02, sequentially forming the first encapsulation layer 118a, the second encapsulation layer 118b, and the third encapsulation layer 118c on a layer where the second electrode 115 of the organic light emitting diode 1d is located, to seal the organic light emitting diode 1d. The ratio of the thickness of the second encapsulation layer 118b on a side of the first post spacer 120 distal to the base plate 101, to the thickness of the first post spacer 120 is 2:1 to 6:1, so that the surface of the formed second encapsulation layer 118b distal to the base plate 101 is substantially flat, which avoids a problem of a failure of encapsulation for the display substrate caused by breakage of the third encapsulation layer 118c formed on the surface of the second encapsulation layer 118b distal to the base plate.

In some embodiments, as shown in FIG. 4, the ratio of the average thickness D1 of the region where an orthographic projection of the second encapsulation layer 118b on the base plate 101 overlaps the first sub-post spacer 120a to the thickness D2 of the first sub-post spacer 120a is 2:1 to 6:1. This is because for the second encapsulation layer 118b, due to the fluidity of the material thereof, the thickness of the second encapsulation layer 118b becomes thinner as it approaches the dam structure 150. That is, the thickness of the second encapsulation layer 118b gradually decreases from the display region Q1 to the transition region Q2, and the first sub-post spacer is arranged adjacent to the dam structure 150, once the ratio of the average thickness D1 of the region where the orthographic projection of the second encapsulation layer 118b on the base plate 101 is overlapped with the first sub-post spacer 120a to the thickness D2 of the first sub-post spacer 120a is 2:1 to 6:1, the ratio of the thickness of the second encapsulation layer 118b at rest positions of the transition region Q2 to the thickness D2 of the first sub-post spacer 120a is necessarily greater than 2:1 to 6:1, therefore, the problem of a failure of the encapsulation for the display substrate due to the breakage of the third encapsulation layer 118c formed on a surface of the second encapsulation layer 118b distal to the base plate 101 may be completely avoided.

Figure 10:
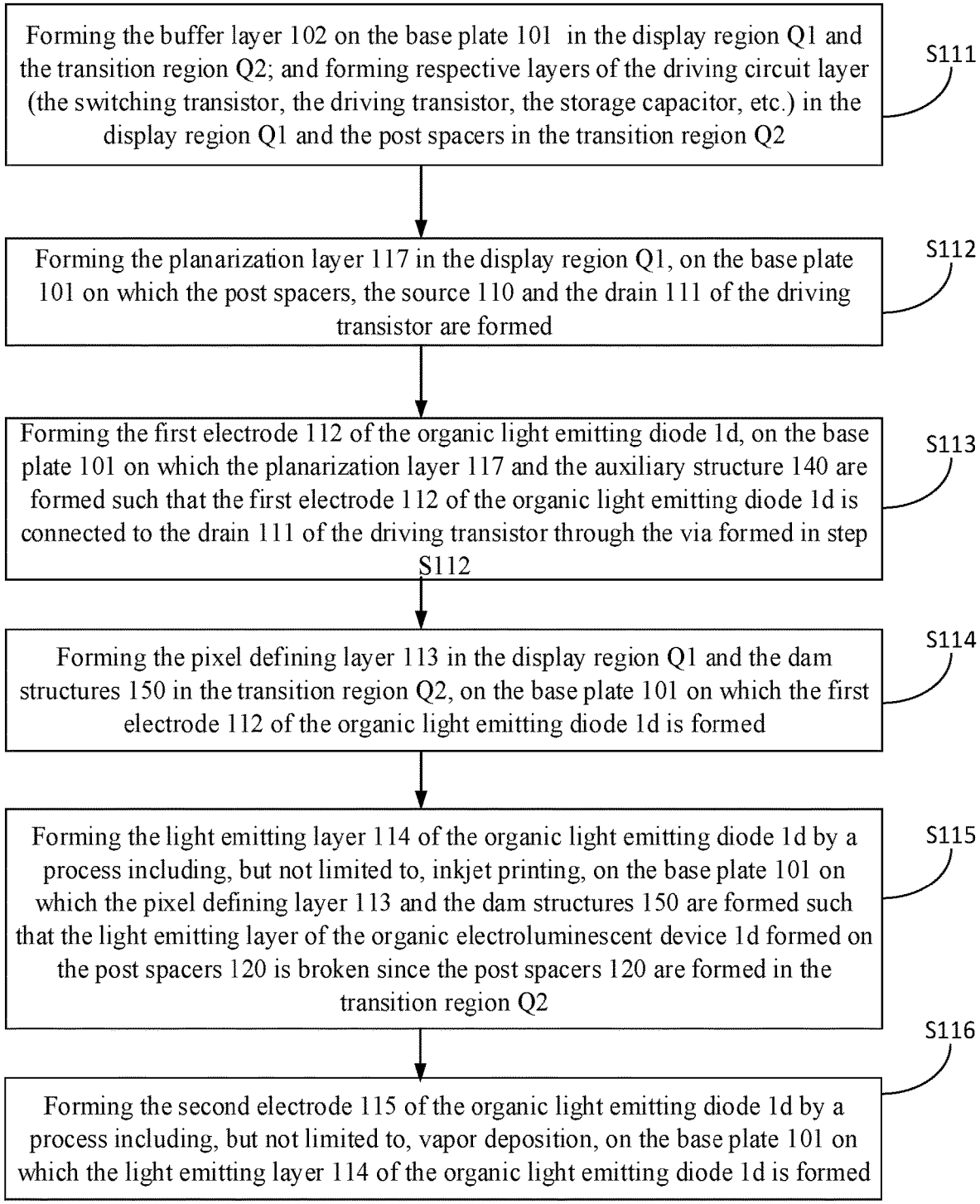
FIG. 10 is a detailed flowchart of step S11.

In the following, an example of the method for manufacturing a display substrate is given for clearly understanding the method for manufacturing a display substrate according to an embodiment of the present disclosure, but the example is not intended to limit the scope of the present disclosure. As shown in FIG. 10, the method specifically includes steps of:

S11, providing a base plate 101, and forming the driving circuit layer, the organic light emitting diode 1d, and the post spacer 120 in the pixel structure on the base plate 101.

Specifically, as shown in FIG. 11, step S11 may include steps of:

S111, forming the buffer layer 102 on the base plate 101 and positioned in the display region Q1 and the transition region Q2; and forming respective layers of the driving circuit layer (the switching transistor, the driving transistor, the storage capacitor, etc.) located in the display region Q1 and the post spacer located in the transition region Q2, such as the active layer 104, the first gate insulating layer 105, the gate 106, the second gate insulating layer 108, the interlayer dielectric layer 103, the source 110, and the drain 111 of the driving transistor. Specifically, the active layer 104 may be formed on the buffer layer 102, the first gate insulating layer 105 covers the buffer layer 102 and the active layer 104, the gate 106 is formed on a side of the first gate insulating layer 105 distal to the active layer 104, the second gate insulating layer 108 covers the gate 106 and the first gate insulating layer 105, the interlayer dielectric layer 103 covers the second gate insulating layer 108, the source 110 and the drain 111 are formed on a side of the interlayer dielectric layer 103 distal to the base substrate and are respectively located on two opposite sides of the gate 106, and the source 110 and the drain 111 may respectively contact with the source contact region and the drain contact region on two opposite sides of the active layer 104 through vias (e.g., metal vias). It should be understood that this driving transistor may also be of the bottom gate type. As shown in FIG. 3, the capacitor structure may include the first electrode plate 130 and the second electrode plate 131, the first electrode plate 130 is disposed in a same layer as the gate 103, and the second electrode plate 131 is disposed between the second gate insulating layer 105 and the interlayer dielectric layer 103 and opposite to the first electrode plate 130.

As shown in FIG. 4, the post spacer includes the first post spacer 120 and the second post spacer 121; wherein the first post spacer 120 includes the first sub-post spacer 120a and the second sub-post spacer 120b. In some embodiments, the first sub-post spacer 120a, the second sub-post spacer 120b, and the second post spacer 121 may be formed in one patterning process together with the source 110 and the drain 111 of the driving transistor. Specifically, when the source 110 and the drain 111 are of a three-layer metal structure, the first sub-post spacer 120a, the second sub-post spacer 120b, and the second post spacer 121 may also be of a three-layer metal structure. That is, the first sub-post spacer 120a, the second sub-post spacer 120b, and the second post spacer 121 each include the first sub-isolation layer 120a1, the second sub-isolation layer 120a2, and the third sub-isolation layer 120a3, which are sequentially stacked distal to the base plate 101.

Forming the first sub-post spacer 120a of a three-layer structure may include steps of:

A first sub-isolation material layer is sequentially formed over the layers through processes including, but not limited to, magnetron sputtering, physical vapor deposition, and the like, and the first sub-isolation layer 120a1 is formed by wet etching.

A second sub-isolation material layer is sequentially formed over the layers through processes including, but not limited to, magnetron sputtering, physical vapor deposition, and the like, and the second sub-isolation layer 120a2 is formed by wet etching.

A third sub-isolation material layer is sequentially formed over the layers through processes including, but not limited to, magnetron sputtering, physical vapor deposition, and the like, and the third sub-isolation layer 120a3 is formed by wet etching.

The orthographic projections of the first sub-isolation layer 120a1 and the third sub-isolation layer 120a3 on the base plate 101 coincide with each other, and an orthographic projection of the second sub-isolation layer 120a2 on the base plate 101 falls within the orthographic projection of the first sub-isolation layer 120a1 on the base plate 101. That is, a cross section of the first post spacer 120a in a direction perpendicular to the base plate 101 has a groove. The first sub-isolation layer 120a1 and the third sub-isolation layer 120a3 of the post spacer 120 are made of Ti, and the second sub-isolation layer 120a2 is made of Al. Alternatively, the post spacer 2 is not limited to the post spacer 120 having a three-layer structure, and the post spacer 120 may have a four-layer structure or even a more-layer structure. When the post spacer 120 includes the three-layer structure of the first sub-isolation layer 120a1, the second sub-isolation layer 120a2, and the third sub-isolation layer 120a3, for the reason of the etching process, particles are attached to a surface of the second sub-isolation layer 120a2 proximal to the third sub-isolation layer 120a3. Specifically, the particles may be silver ions displaced in the etching solution when the structure of the first sub-post spacer 120a is formed by etching. Alternatively, for the reason of the process, the third sub-isolation layer 120a3 warps relative to a plane where the base plate 101 is located (i.e. warps towards a direction distal to the base plate 101).

S112, forming the planarization layer 117 located in the display region Q1 and the auxiliary structure 140 located in the transition region, on the base plate 101 on which the post spacer, the source 110 and the drain 111 of the driving transistor are formed, and forming a via penetrating through the planarization layer 116 and the interlayer insulating layer 117, at a position corresponding to the drain 111 of the driving transistor in the driving circuit layer of the display region Q1.

In some embodiments, the planarization layer 117 and the auxiliary structure 140 formed in step S112 are disposed in a same layer and have the same material, that is, the planarization layer 117 and the auxiliary structure 140 are formed through one patterning process.

S113, forming the first electrode 112 of the organic light emitting diode 1d, on the base plate 101 on which the planarization layer 117 and the auxiliary structure 140 are formed, and the first electrode 112 of the organic light emitting diode 1d is connected to the drain 111 of the driving transistor through the via formed in step S112.

S114, forming the pixel defining layer 113 in the display region Q1 and the dam structure 150 in the transition region Q2, on the base plate 101 on which the first electrode 112 of the organic light emitting diode 1d is formed; wherein the pixel defining layer 113 is formed with the receiving portion at a position corresponding to the first electrode 112 of the organic light emitting diode 1d, and the dam structure 150 close to the opening regions Q3 is disposed on the auxiliary structure 140.

In some embodiments, the pixel defining layer 113 and the dam structure 150 formed in step S114 are disposed in a same layer and have the same material, that is, the pixel defining layer 113 and the dam structure 150 are formed through one patterning process.

S115, forming the light emitting layer 114 of the organic light emitting diode 1d by a method including, but not limited to, inkjet printing, on the base plate 101 on which the pixel defining layer 113 and the dam structure 150 are formed. The post spacers 120 are formed in the transition region Q2, so that the light emitting layer of the organic electroluminescent device 1d formed over the post spacers 120 is disconnected.

S116, forming the second electrode 115 of the organic light emitting diode 1*d* by a process including, but not limited to, vapor deposition, on the base plate 101 on which the light emitting layer 114 of the organic light emitting diode 1*d* is formed.

Thus, the driving circuit layer, the organic light emitting diode 1*d*, and the post spacer 120 have been manufactured.

It should be noted that as shown in FIG. 3, in step S112, the passivation layer 116 may be formed firstly; the via is formed at a position of the passivation layer 116 corresponding to the drain 111 of the driving transistor; the connection electrode 133 is formed on a side of the passivation layer 116 distal to the base plate 101, so that the connection electrode 133 is connected to the drain 111 of the driving transistor through the via penetrating through the passivation layer 116; and then, the first sub-planarization layer 117*a* and the second sub-planarization layer 117*b* are sequentially formed, and the via is formed at a position of the first sub-planarization layer 117*a* and the second sub-planarization layer 117*b* corresponding to the connection electrode 133. Step S113 is then performed to connect the first electrode 112 of the organic light emitting diode 1*d* formed in step S113 to the connection electrode 133 through the via penetrating through the first sub-planarization layer 117*a* and the second sub-planarization layer 117*b*.

S12, forming the first encapsulation layer 118*a* on the base plate 101 on which the second electrode 115 of the organic light emitting diode 1*d* is formed.

The material of the first encapsulation layer 118*a* may be SiNx, SiON, SiOx, etc., and the first encapsulation layer 118*a* may be formed by chemical vapor deposition, physical vapor deposition, atomic force deposition, etc.

S13, forming the support structure (not shown) located in the opening region Q3 on the base plate 101 on which the first encapsulation layer 118*a* is formed.

Specifically, the support structure may be formed on the opening region by chemical vapor deposition, physical vapor deposition, atomic force deposition, inkjet printing, spraying, and the like. The material of the support structure may be at least one of polyamide, polyester, polycarbonate. These materials with high curing speed are used to directly prevent the materials from flowing.

S14, forming the second encapsulation layer 118*b* on a side of the dam structure 150 proximal to the display region Q1 on the base plate 101 on which the support structure is formed.

The orthographic projection of the second encapsulation layer 118*b* on the base plate 101 is located in a part of the transition region Q3 and the display region Q1. The material of the second encapsulation layer 118*b* may include an acrylic-based polymer, a silicon-based polymer, and the like. The second encapsulation layer 118*b* may be formed on the first encapsulation layer 118*a* by inkjet printing, spraying, or the like.

S15, forming the third encapsulation layer 118*c* on the base plate 101 on which the second encapsulation layer 118*b* is formed.

The orthographic projection of the third encapsulation layer 118*c* on the base plate 101 is located in the transition region Q2 and the display region Q1. The material of the third encapsulation layer 7 may be SiNx, SiCN, SiO2, etc., and the third encapsulation layer 118*c* may be formed by chemical vapor deposition, physical vapor deposition, atomic force deposition, etc.

It should be noted that the first encapsulation layer 118*a* formed in step S12 and the third encapsulation layer 118*c* formed in step S15 are inorganic encapsulation layers, and the second encapsulation layer 118*b* formed in step S14 is an organic encapsulation layer.

S16, forming a protective layer (not shown) on the base plate 101 on which the third encapsulation layer 118*c* is formed, wherein the support structure supports the protective layer.

Specifically, the protective layer is formed on a side of the third encapsulation layer 118*c* distal to the base plate 101, and the support structure 8 supports the protective layer. The protective layer is jacked up by the support structure, to prevent the protective layer from being too large in falling head of films in the opening region Q3 and the display region Q1, so that the flatness of the protective layer is improved. Therefore, when the protective layer is torn off, the third encapsulation layer 118*c* cannot be lifted, to prevent the third encapsulation layer 118*c* from being stripped from the second encapsulation layer 118*b*, so that the encapsulation effect is guaranteed, and the product yield of the display panel is improved.

S17, stripping the protective layer.

Specifically, in the MDL process segment, the protective layer needs to be stripped firstly, and then, POL is attached. Due to the support structure, the third encapsulation layer 118*c* is not lifted when the protective layer is stripped, so that the third encapsulation layer 118*c* is prevented from being stripped from the second encapsulation layer 118*b*.

S18, forming the through hole in a region corresponding to the opening region Q3.

Specifically, after the protective layer is stripped, the through hole is formed in the opening region Q3, thereby achieving the purpose of punching on the screen. When the through hole is formed in the opening region, the support structure is located on the opening region, and a region corresponding to the opening region of the display substrate and the support structure may be removed simultaneously through one process. Alternatively, the opening region and the support structure on the display substrate may be removed by two processes, which is not limited in the embodiment of the present disclosure.

In a second aspect, an embodiment of the present disclosure further provides a display panel, which includes the above display substrate. The display panel may be applied to, for example, an electronic device having a display panel, such as a mobile phone, a tablet computer, an electronic watch, a sports bracelet, and a notebook computer. The technical effects which may be achieved by the display device may refer to the above discussion of the technical effects achieved by the display panel, and are not described herein again.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate having an opening region, a transition region surrounding the opening region, and a display region surrounding the transition region; wherein the display substrate comprises:
a base plate,
post spacers and dam structures on the base plate, located in the transition region and surrounding the opening region; wherein the post spacers comprise a first post spacer on a side of the dam structures proximal to the display region;

an organic light emitting diode, a first encapsulation layer, a second encapsulation layer and a third encapsulation layer sequentially arranged on the base plate, wherein the organic light emitting diode is in the display region, and orthographic projections of the first encapsulation layer and the third encapsulation layer on the base plate at least cover the display region and the transition region; and an orthographic projection of the second encapsulation layer on the base plate covers the display region and the first post spacer in the transition region; wherein a ratio of a thickness of a part of the second encapsulation layer on the first post spacer to a thickness of the first post spacer is 2:1 to 6:1.

2. The display substrate according to claim 1, wherein the first post spacer comprises a first sub-post spacer adjacent to the dam structures, and a ratio of an average thickness of a region of the second encapsulation layer where the orthographic projection of the second encapsulation layer on the base plate overlaps the first sub-post spacer to a thickness of the first sub-post spacer is 2:1 to 6:1.

3. The display substrate according to claim 2, wherein a ratio of a thickness of the region of the second encapsulation layer where the orthographic projection of the second encapsulation layer on the base plate overlaps the first sub-post spacer to the thickness of the first sub-post spacers is 6:1.

4. The display substrate according to claim 3, wherein the thickness of the second encapsulation layer gradually decreases from the display region to the transition region.

5. The display substrate according to claim 4, wherein the first sub-post spacer comprises: a first sub-isolation layer, a second sub-isolation layer and a third sub-isolation layer which are sequentially stacked; and orthographic projections of the first sub-isolation layer and the third sub-isolation layer on the base plate coincide with each other, and an orthographic projection of the second sub-isolation layer on the base plate falls in the orthographic projection of the first sub-isolation layer on the base plate.

6. The display substrate according to claim 5, wherein each of the first sub-isolation layer and the third sub-isolation layer has a thickness of 0.04 μm to 0.08 μm; and a thickness of the second sub-isolation layer is 0.4 μm to 0.6 μm; and/or a material of each of the first sub-isolation layer and the third sub-isolation layer comprises titanium and a material of the second post spacer comprises aluminum.

7. The display substrate according to claim 5, wherein the display substrate further comprises particles attached to a surface of the second sub-isolation layer proximal to the third sub-isolation layer; and/or the third sub-isolation layer is warped relative to a plane where the base plate is located.

8. The display substrate according to claim 4, further comprising a groove on a lateral side of the first sub-post spacer.

9. The display substrate according to claim 1, wherein the display substrate further comprises a driving circuit layer on the base plate; the driving circuit layer at least comprises a driving transistor, and a drain of the driving transistor is connected to a first electrode of the organic light emitting diode; a source and the drain of the driving transistor and the post spacers are in a same layer and are made of a same material.

10. The display substrate according to claim 9, further comprising a planarization layer between the source and the drain of the driving transistor and a layer where the first electrode of the organic light emitting diode is located; and the drain of the driving transistor is connected to the first electrode of the organic light emitting diode through a via penetrating through the planarization layer.

11. The display substrate according to claim 9, further comprising a passivation layer, a connection electrode, a first sub-planarization layer and a second sub-planarization layer which are sequentially arranged between the source and the drain of the driving transistor and a layer where the first electrode of the organic light emitting diode is located; the connection electrode is connected to the drain of the driving transistor through a via penetrating through the passivation layer and the first sub-planarization layer, and the first electrode of the organic light emitting diode is connected to the connection electrode through a via penetrating through the second sub-planarization layer.

12. The display substrate according to claim 10, further comprising a plurality of dam structures which are in the transition region, and are adjacent to each other; an auxiliary structure which is below at least a dam structure of the plurality of the dam structures proximal to the opening region such that the dam structure in two adjacent dam structures proximal to the opening region protrudes from a direction distal to the base plate than the other dam structure; and the auxiliary structure and the planarization layer are in a same layer and are made of a same material.

13. The display substrate according to claim 1, wherein the display substrate further comprises a driving circuit layer on the base plate; the driving circuit layer at least comprises a driving transistor and an interlayer dielectric layer, an active layer of the driving transistor is on a side of the base plate proximal to the organic light emitting diode; a first gate insulating layer covers the active layer, a gate of the driving transistor is arranged on a side of the first gate insulating layer distal to the active layer; a second gate insulating layer covers the gate and the first gate insulating layer; the interlayer dielectric layer covers the second gate insulating layer; the source and the drain of the driving transistor are on a side of the interlayer dielectric layer distal to the base plate; the first post spacer comprises a first sub-post spacer adjacent to the dam structures and a second sub-post spacer on a side of the first sub-post spacer proximal to the display region; and a first slot is arranged between the first sub-post spacer and the second sub-post spacer, and a second slot is arranged between the first sub-post spacer and the dam structures; the first slot and the second slot penetrate through at least one of the interlayer dielectric layer, the first gate insulating layer and the second gate insulating layer.

14. The display substrate according to claim 1, wherein a thickness of the first encapsulation layer is 1 μm to 2 μm; a thickness of the second encapsulation layer is 10 μm to 15 μm; and a thickness of the third encapsulation layer is 0.5 μm to 1 μm.

15. A method for manufacturing a display substrate having an opening region, a transition region surrounding the opening region, and a display region surrounding the transition region; the method for manufacturing the display substrate comprises steps of:

forming post spacers and dam structures on a base plate such that the post spacers and the dam structures are both arranged in the transition region and surround the opening region; the forming the post spacers comprises forming a first post spacer such that the first post spacer is arranged on a side of the dam structures proximal to the display region; and sequentially forming an organic light emitting diode, a first encapsulation layer, a second encapsulation layer and a third encapsulation layer on a side of a layer where the post spacers are located distal to the base plate such that the organic light emitting diode is located in the display region, and orthographic projections of the first encapsulation layer and the third encapsulation layer on the base plate at least cover the display region and the transition region; and an orthographic projection of the second encapsulation layer on the base plate covers the display region and the first post spacer of the transition region;

wherein a ratio of a thickness of a part of the second encapsulation layer on the first post spacer to a thickness of the first post spacer is 2:1 to 6:1.

16. The manufacturing method according to claim 15, wherein the first post spacer comprises a first sub-post spacer adjacent to the dam structures, and a ratio of an average thickness of a region of the second encapsulation layer where the orthographic projection of the second encapsulation layer on the base plate overlaps the first sub-post spacer to the thickness of the first sub-post spacer is 2:1 to 6:1.

17. The manufacturing method according to claim 15, further comprising: forming a driving circuit layer on a side of the post spacers proximal to the base plate such that the driving circuit layer at least comprises a driving transistor; and forming a source and a drain of the driving transistor and the post spacers through one single patterning process.

18. The manufacturing method according to claim 17, further comprising forming a pixel defining layer having a receiving portion that receives a light emitting layer between forming a first electrode of the organic light emitting diode and forming the light emitting layer of the organic light emitting diode such that the dam structures and the pixel defining layer are formed through one single patterning process.

19. The manufacturing method according to claim 18, wherein the dam structures comprise a plurality of dam structures in the transition region, which are adjacent to each other; an auxiliary structure is formed below at least a dam structure of the plurality of the dam structures proximal to the opening region such that the dam structure in two adjacent dam structures proximal to the opening region protrudes from a direction distal to the base plate than the other dam structure; a planarization layer is formed between a layer where the source and the drain of the driving transistor are located and a layer where the first electrode of the organic light emitting diode is located, and the first electrode is connected to the drain of the driving transistor through a via penetrating through the planarization layer; and the auxiliary structure and the planarization layer are formed through one single patterning process.

20. A display panel, comprising the display substrate according to claim 1.

* * * * *